United States Patent [19]

Deaton et al.

[11] 4,229,726

[45] Oct. 21, 1980

[54] PORTABLE ELECTRONIC TRAFFIC EVENT RECORDER

[75] Inventors: Willis R. Deaton, Huntersville; John I. Clark, Jr., Newell; Harold M. Raynor, Charlotte, all of N.C.

[73] Assignee: City of Charlotte, Charlotte, N.C.

[21] Appl. No.: 963,462

[22] Filed: Nov. 24, 1978

[51] Int. Cl.[3] .................... H03K 21/32; G06F 15/48; G08G 1/00

[52] U.S. Cl. ............................ 340/38 R; 235/92 TC; 340/365 R

[58] Field of Search ................. 340/38 R, 365 R, 705, 340/711, 712, 365 S; 235/92 TC, 432; 364/436, 437, 438

[56] References Cited

U.S. PATENT DOCUMENTS

| | | | |
|---|---|---|---|
| 2,958,567 | 11/1960 | Oxley et al. | 235/92 TC |
| 2,995,411 | 8/1961 | Morris et al. | 235/92 TC |
| 3,099,512 | 7/1963 | Kohler | 235/92 TC |
| 3,187,321 | 6/1965 | Kameny | 340/365 R |
| 3,711,686 | 1/1973 | Apitz | 235/92 TC |
| 3,879,722 | 4/1975 | Knowlton | 340/705 |
| 3,978,321 | 8/1976 | Doggett | 235/92 TC |

*Primary Examiner*—Thomas A. Robinson
*Attorney, Agent, or Firm*—Richards, Shefte & Pinckney

[57] ABSTRACT

Apparatus for recording traffic events occurring at a variety of vehicular traffic passageways, such apparatus including a portable housing unit having a keyboard presenting a predetermined pattern of pushbutton switches. A plurality of interchangeable display boards, each having different vehicular traffic patterns and symbolic traffic events displayed thereon, are selectively mounted over the keyboard, and each symbolic traffic even coincides with a particular pushbutton when so mounted. Choice of a suitable display board corresponding to a particular intersection and a desired type of traffic count allows a traffic checker to complete a traffic count by merely pressing a push-button switch corresponding to each observed traffic event and its location. The portable housing includes a data processor which places a switch- and time-identified signal in its memory for each pushbutton depression and may later be plugged into a master computer for abstraction, processing, and tabulated print-out of the recorded data according to the pre-programming of the master computer.

5 Claims, 6 Drawing Figures

PORTABLE ELECTRONIC TRAFFIC EVENT RECORDER

BACKGROUND OF THE INVENTION

Traffic volume studies are conducted whenever it is desired to know the number of vehicles or pedestrians passing a point, entering an intersection, or utilizing a particular facility such as a traffic lane, crosswalk, or sidewalk. Such counts are merely a sample of actual volumes and the sampling period may range from a few minutes to a week or more at a given location.

The reasons for making volume counts may vary significantly. Counts are utilized to determine the composition and amount of traffic on roadways; to determine the number of vehicles traveling on, in, or through an area; to evaluate accident data; to serve as a basis for traffic signal timing; to obtain data useful for planning for new roadways and determining geometric designs; to determine growth trends; and many other purposes.

The kind of information collected and tabulated also varies. In some cases, details on the composition of vehicles in a traffic stream are required, while others require specific data on pedestrian and vehicle directional movements.

The two basic methods of obtaining traffic counts at the present time are mechanical devices which automatically record certain traffic events, and manual counts taken by field personnel.

Most mechanical devices for making automatic counts are used when only a simple tabulation is needed of number of vehicles; i.e., no separation of vehicle type, direction, turning movements, pedestrians, lane use, etc. There are three general types of portable mechanical counters currently known to be in use: (1) junior counter, which is a continuation-type totalizer counter with a visual numerical register and is powered by a dry cell battery; (2) period counter, which is a special version of the junior counter and which has a time clock that can be set to activate the counter at a specific time and then run only for a definite length of time; and (3) senior counter, which is a recording-type counter that contains a clock, a reset-type stamping and/or punching mechanism or event pens, a roll of tape or a circular chart, and that is powered by batteries. Each of these counters utilizes devices to sense vehicle movement over a given point in the roadway and then increment the counting register. There are several types of detection or sensing devices currently in use including the road tube, electric contact plates, photocells, radar magnetic or magnetometer detectors, ultrasonic and infra-red detectors, and induction loops.

Junior counters do not provide a printed record of volume counts, so the count accumulator must be read and recorded at the field location at the beginning and completion of each counting period.

The senior counter recorder stores vehicle actuations in an accumulating register, and, upon clock actuation, prints the results at pre-selected intervals. Several methods are available for recording the count data, such as printed tape, circular charts and punch tape.

In general, the compilation of traffic counts from mechanical devices into useable summary formats requires a considerable amount of manual tabulation. Data reduction is therefore expensive and time-consuming. However, punched tape can be processed through a translator which, when connected to a keypunch or reader, will produce count tabulations more efficiently than other current methods.

The aforesaid manual counting is a method of obtaining volume data through the use of field personnel known as traffic checkers. Manual counting is required when the information desired cannot be obtained through mechanical devices. This includes the classification of vehicles by size, type, number of occupants or other features, the recording of turning movements at intersections, and other specific vehicular or pedestrian movements. Basically, manual counting methods have not advanced much in recent times, and consist essentially of observers utilizing tally marks to record observations.

Today, the basic device employed almost universally to conduct manual traffic counts is the tally counter which is simply a mechanized tally marker that eliminates the need for checkers to take their eyes off the roadway to make tally marks. These counters are usually mounted in banks (one bank for each intersection approach) on a clipboard.

Counter totals are transferred by the checkers at specific time intervals to field sheets tailored for each counting location. Field sheets are set up for whatever time period is desired, i.e., five, fifteen, thirty, or sixty minute periods. A new tally sheet must be utilized for each discrete time period observed. These sheets must then be tabulated by office personnel and manually transferred to a volume count summary form by time period, approach, and directional movement.

While the manual counting method or device has remained somewhat primitive, some improvements have taken place with regard to transcribing the tally register totals and the preparation of tabulated summaries.

Mark-sense data processing cards have been used for some years in lieu of the time interval tally sheets. These cards greatly reduced the data reduction effort required by office personnel. However, due to continual mechanical problems encountered with card reading devices processing mutilated cards returned by field personnel an alternative method of recording data was devised, and in recent years an optical scanning form for tally sheets has been used in lieu of mark-sense cards.The marked optical scanning sheets are processed through a reader which transcribes the data onto magnetic tape. The magnetic tape is then delivered to a suitable computer for processing. A tabulated event summary by time period is returned from the computer in the form of a hard copy printout for traffic analysis.

The portable electronic traffic event recording apparatus of the present invention eliminates all of the aforesaid tally cards or sheets and requires for each traffic count only that the traffic checker be posted at a vehicle passageway or intersection with a corresponding suitable traffic pattern display board mounted on the recording apparatus, and the apparatus with display board suitably oriented to the passageway or intersection. After the checker has put a signature switch on the apparatus to the ON position, he need only observe the traffic events as they occur, depressing at each occurrence one of a number of push button switches respectively corresponding to the location and character of each event desired to be observed and recorded as displayed on the display board. Each switch depression creates an electrical signal which is recorded in an electronic memory contained in the recording apparatus, and each such signal is automatically recorded in the memory with an identity as to its particular switch source and the particular time period within which it occurred. The usual five minute time periods preclude the possibility of data fabrication, provide a record of on-off times and checker diligence, and eliminate the need for the checker to transfer count data to tally sheets or to keep track of time intervals.

When a period of counting is complete, the portable recording apparatus of the present invention may be plugged in to a master computer which will automatically extract the recorded data from the portable apparatus, process the data for one or more counts according to the master computer's predetermined software program, and print out a tabulation of each count in an appropriate form as determined by the program of the master computer.

The present invention eliminates time waste, possibility of confusion and fabrication of data, paper shuffling by field or office personnel, and reduces traffic counting to its simplest elements.

SUMMARY OF THE INVENTION

The apparatus for recording traffic events occurring at a variety of vehicular traffic passageways of the present invention includes a portable housing unit, an electronic data processing means contained in the housing unit, and a plurality of display boards each displaying different vehicular traffic patterns and symbolic traffic events thereon and being selectively and alternately mountable on the portable housing unit. The apparatus further includes a plurality of manually operated signalling means disposed at predetermined locations selected to cause at least some of the signalling means to coincide with particular ones of the symbolic traffic events displayed on each display board when mounted on the housing unit, each of the coinciding signalling means generating an electrical signal each time it is operated. Also included is electrical means interconnecting the plurality of signal means and the electronic data processing means, and the electronic data processing means includes an electronic memory means for receiving and storing the electrical signals generated by the signalling means.

Preferably the apparatus of the present invention includes electrical transfer means having an external outlet for permitting the electronic data processing means to be connected to a master computer for abstracting the stored electrical signals from the electronic memory means for processing by the master computer, and a timing means is provided for generating a timing signal at predetermined time intervals and is connected to the electronic data processing means for transmitting the timing signals thereto to provide a time frame for the electrical signals generated by the signalling means.

In the preferred embodiment of the present invention the housing unit includes mounting means to which all of the signalling means are mounted at fixed locations thereon, and each display board is suitably shaped to be selectively superimposed on the mounting means in fixed relation thereto. Each display board has a plurality of openings formed therein at locations associated with the symbolic traffic events displayed thereon to correspond with and thereby expose one of the signalling means at each symbolic traffic event display when the display board is so superimposed on the mounting means. In the preferred embodiment, the signalling means comprise push button switches.

DESCRIPTION OF THE PREFERRED EMBODIMENT

The portable electronic traffic event recorder of the present invention provides a generally foolproof, self-contained, and eminently simple and effective apparatus for time-based recording of an infinite variety of traffic events occurring in virtually any type of traffic pattern, and further provides for completely automatic processing of the recorded data into finished, tabulated hard-copy reports by plugging the recorder into a master or host computer which abstracts the recorded event data from the recorder, stores the data in its own memory, and produces hard-copy tabulations of the event occurrences in whatever format may be pre-programmed into the computer.

Figure 1:
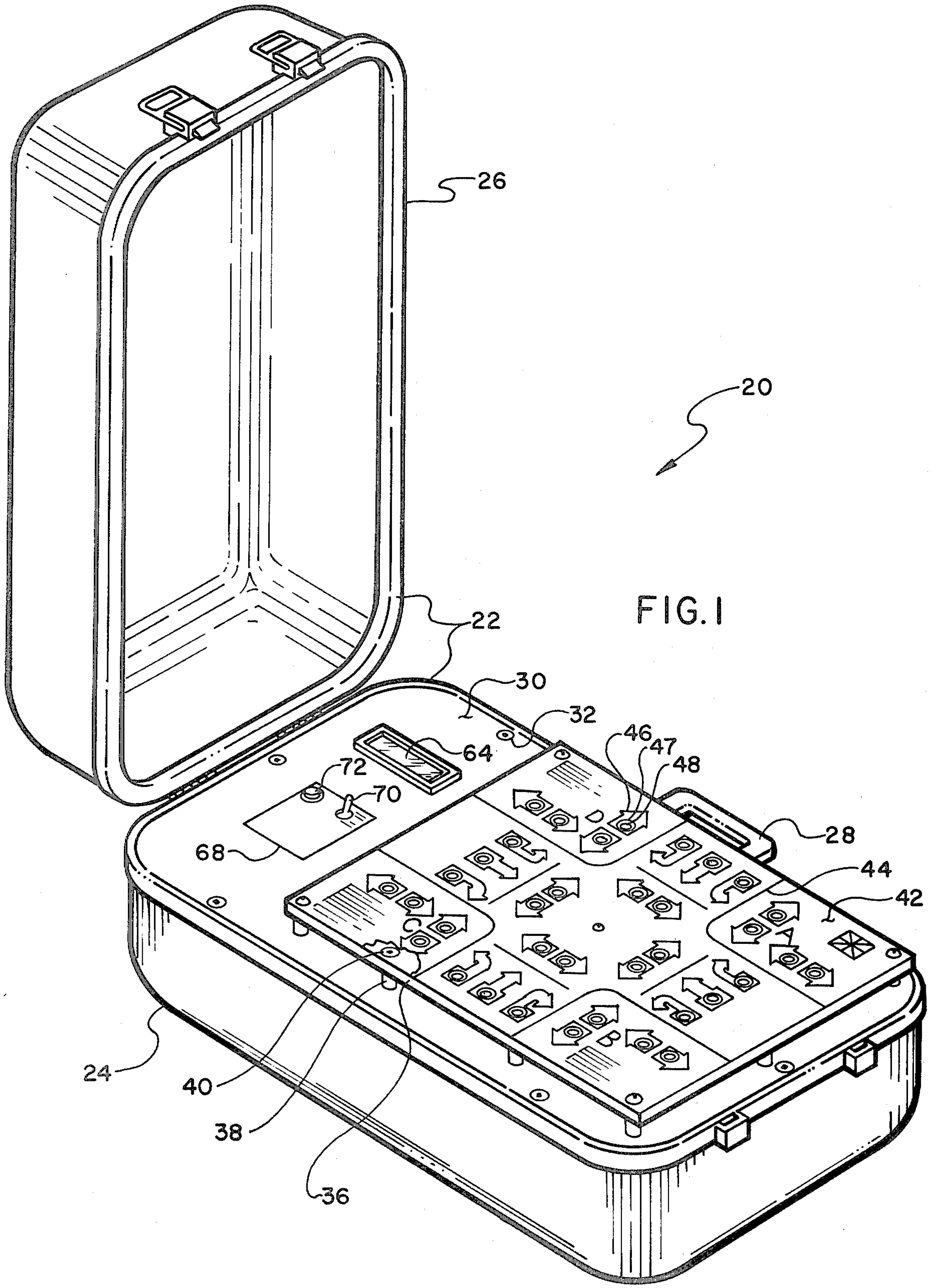
FIG. 1 is a perspective view of the portable electronic traffic event recorder of the present invention with the housing cover open and a traffic pattern display board in place over its pushbutton keyboard.
Figure 2:
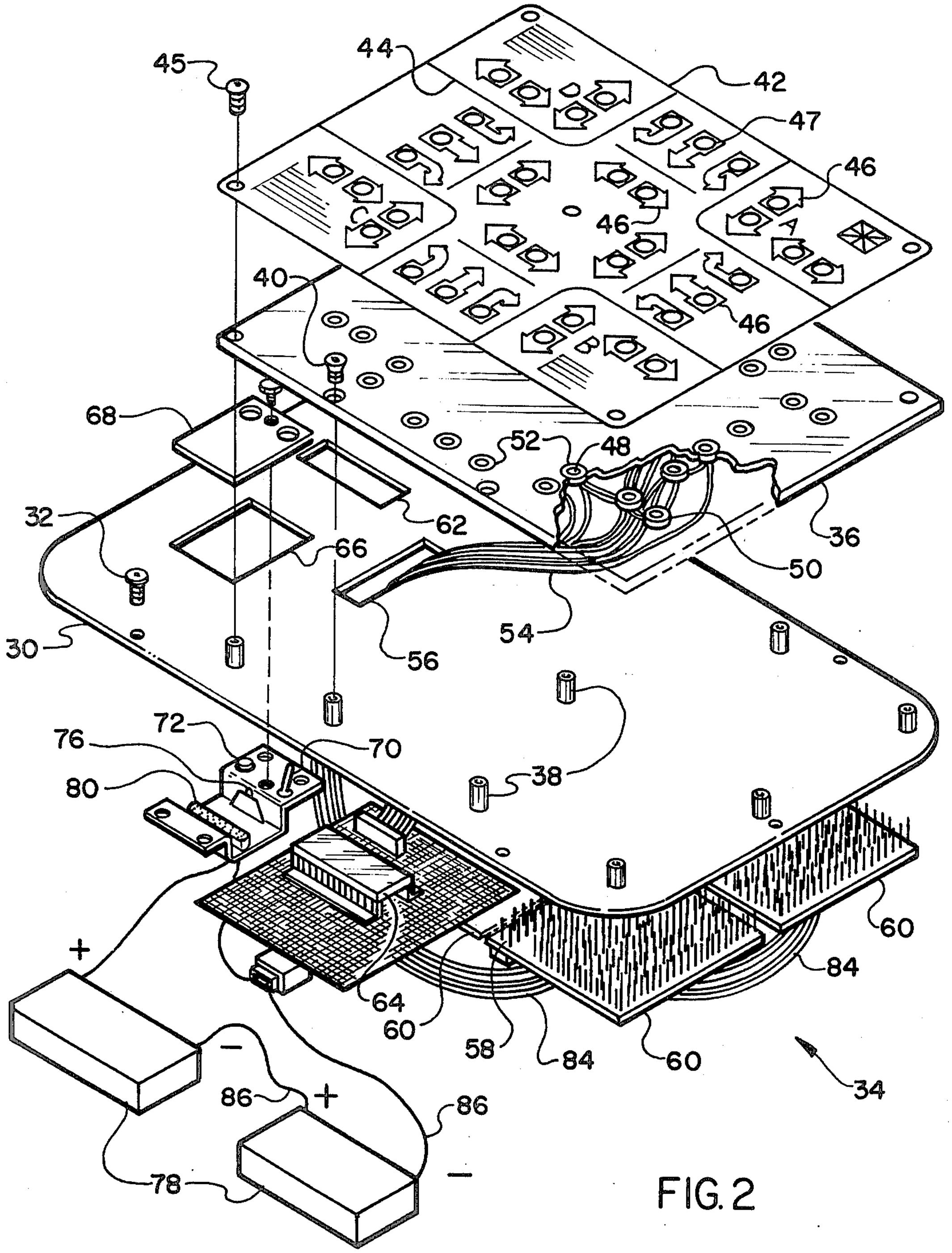
FIG. 2 is an exploded perspective view of the recorder as shown in FIG. 1, without its housing.

A portable recording apparatus 20 according to the present invention is shown in FIGS. 1 and 2 and includes a portable housing unit 22 having a base container portion 24, a hinged lid 26, and a folding carrying handle 28. Brackets (not shown) attached to the interior of the base portion 24 permit fastening an enclosing panel 30 to the base portion 24 inside the upper part thereof with a number of screws threaded into the brackets. Electronic data processing means 34 is attached to the underside of the panel 30 and contained in the base portion 24. A keyboard mounting base means 36 is supported in spaced relation above the panel 30 by spacers 38 affixed to the panel 30 and flat head screws 40 threaded into the spacers 38.

A plurality of display boards 42, each displaying a different traffic pattern 44 thereon, are provided for alternate selective mounting superimposed on the mounting base 36 in fixed relation thereto by screws 45 for displaying the different traffic patterns 44 and symbolic traffic events 46 representing the traffic events which may occur at a variety of vehicular or other traffic passageways and which are found desirable to observe, record, and tabulate for later traffic control or engineering purposes. The display board 42 shown in FIGS. 1 and 2 displays thirty-six different symbolic traffic events 46 disposed thereon at locations generally representing the locations (with respect to a four-way intersection traffic pattern) where the actual traffic events would occur.

Each symbolic traffic event 46 displayed on a board 42 includes an opening 47 in the board which exposes a manually operated signaling means comprising the pushbutton 48 of a pushbutton switch 50 when the board 42 is mounted on the base 36. In this preferred embodiment of the invention, thirty-six pushbutton switches 50 are mounted to the mounting base 36 with their pushbuttons 48 extending upwardly through thirty-six holes 52 disposed at predetermined fixed locations in the base 36 which thereby determine fixed locations for the pushbuttons 48 and the switches 50. The predetermined locations for the holes 52 are selected such that the openings 47 in the symbolic traffic events 46 (suitably located with respect to the traffic patterns 44) and the holes 52 will coincide to expose a pushbutton 48 at each opening 47. Where less complicated traffic patterns 44 are displayed on particular display boards 42, and less than thirty-six symbolic traffic events 46 are displayed thereon, only some of the pushbuttons 48 (less than thirty-six) will be exposed.

The pushbutton switches 50 have normally open, single pole electrical contacts (not shown) which are suitably interconnected with the electronic data processing means by a plug-in flat cable or electrical transfer means 54 allowing use of a different keyboard mounting base 36 when different predetermined locations for the holes 52 are desired. The flat cable 54 extends through an opening 56 in the panel 30 for connection to a plug-in strip 58 along one side of one of a plurality of circuit boards 60 included in the data processing means 34. Another opening 62 in the panel 30 has mounted therein a liquid crystal display 64 having 6-digit display capacity for display of time or other data. A third opening 66 in the panel 30 has a small removable coverplate 68 mounted therein through a hole in which an OFF-ON toggle type signature switch 70 protrudes for signaling the initiation of a traffic count to the data processing means 34. The plate 68 also has protruding through another hole therein a pushbutton switch 72 for changing the type of data shown on the liquid crystal display 64. Mounted concealed beneath the small cover plate 68 is a master on-off toggle switch 76 for disconnecting a pair of storage batteries 78 from the balance of the data processing means 34 and a receptacle 80 for plugging the data processing means 34 into a host or master computer 82 and for plugging the batteries 78 into a recharger (not shown). In general, the electrical and electronic elements of the data processing means 34 are interconnected by a plurality of flat cables or electrical transfer means 84 extending therebetween, most terminating at the plug-in strips 58 of the circuit boards 60, though some elements are connected by ordinary wiring 86 as at the batteries 78.

The electronic data processing means 34 is generally conventional and may take any of a variety of known forms, as would be apparent to one skilled in the data processing art. Although the details of the data processing means 34 form no part of the present invention, a brief summary of the components of such data processing means 34, together with the schematic diagram thereof shown in FIG. 6, will serve to indicate the nature of a typical data processing circuit that would be suitable for use in the present invention.

Figure 6:
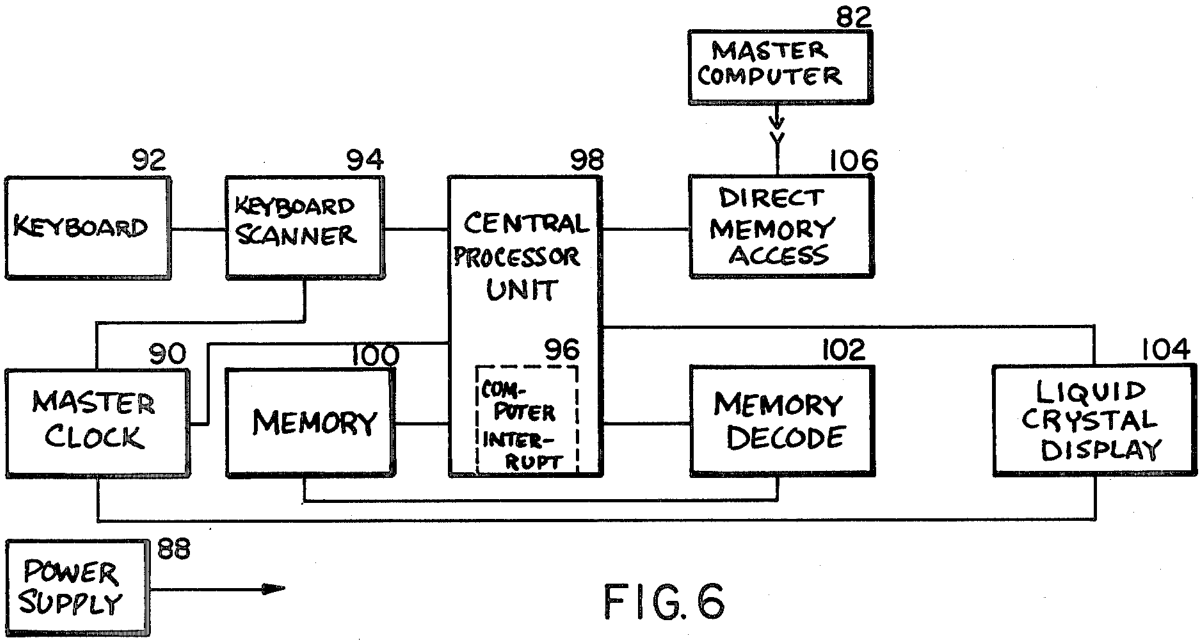
FIG. 6 is a block diagram showing schematically the data processing relations of the electrical elements of the recorder and a master computer.

The block diagram shown in FIG. 6 illustrates schematically the arrangement of the electronic data processing means 34. All blocks except the master computer 82 represent circuit areas or modules contained within the apparatus 20 of the invention, and the circuits are connected together generally as schematically indicated by the lines connecting the various blocks, the lines indicating signal or data transfer means therebetween, except that a power supply circuit 88 is suitably connected to all other circuits. The various circuits are characterized as follows:

Power Supply Circuit 88: Batteries 78 carried in the portable apparatus 20 supply electrical energy which is in turn regulated and supplied throughout the apparatus electronics at 5 volts. The batteries are rechargeable through an external connection.

Master Clock Circuit 90: A crystal controlled oscillator has a fine adjustment and is tuned to a frequency of 2.097152 megahertz. Dividers produce several lower frequencies for use in the electronic data processing means 34, including a 1 hertz signal which is the basic incremental time unit for time readout and for building the time periods in which signals are identified as received.

Keyboard Circuit 92: 40 switch circuits are provided, divided into 5 banks of 8 circuits each. A normally-open single pole pushbutton switch 50, the basic signaling element of the apparatus, is provided for series connection in each of thirty-six of the switch circuits, leaving 4 spare circuits. In each bank of circuits, one side of each of all 8 circuits thereof is commonly connected. A connection is made from each such common connection, and from the other side of each of the 40 circuits, to the keyboard scanner circuit 94.

Keyboard Scanner Circuit 94: The signature switch 70 sets the data processing means 34 for a traffic event count during which an 8192 hertz signal from the timing unit 90 paces repetitive electronic scanning of the individual keyboard switch circuits in sequence at the 8192 hertz rate. When a closed switch 50 is detected during the scanning, the scanning sequence is halted, to be restarted at the beginning only after the switch 50 has re-opened upon pushbutton 48 release, signals being sent to others of the circuits indicating a closed switch 50 signal and its respective keyboard switch 50 source. The closed switch signal goes to the computer interrupt circuit 96.

Computer Interrupt Circuit 96: This circuit gives warning that a signal from the keyboard circuit 92 or the timing circuit 90 is ready for processing by a central processor unit circuit 98.

Central Processor Unit Circuit 98: This circuit controls all electronic elements of the electronic data processing means 34 and includes the computer interrupt circuit 96. This circuit 98 selects incoming signals from the keyboard circuit 92 and the timing circuit 90 when interrupted and causes them to be entered into the memory circuit 100 in suitable sequence with identity as to source and in a time frame period derived from the timing unit circuit 90. This circuit 98 also causes the stored signals to be removed from the memory circuit 100 when requested.

Memory Circuit 100: This circuit stores the keyboard circuit 92 signals and the timing circuit 90 signals until called for.

Memory Decode Circuit 102: This circuit translates signals processed by the central processor unit circuit 98 into signals usable by the memory circuit 100 and vice versa.

Liquid Crystal Display Circuit 104: This circuit decodes signals from the central processor unit 98 to display time or other functions on the liquid crystal display 64, which has a six-digit numerical display and is part of this circuit 104.

Direct Memory Access Circuit 106: This circuit is controlled by the master computer 82 to put the central processor unit 98 in a mode to receive and store data from the master computer 82 or to supply stored traffic event and time period data from the memory 100 to the master computer 82.

The master computer 82 instructs the electronic data processing means 34 (when connected thereto) for the upcoming recording activities thereof according to the software programming of the master computer, and after such recording (when the processing means 34 is again plugged into the master computer 82) removes the recorded data from the processing means 34 for storage and processing in the master computer 82 to produce visual display or hard copy readouts in desired form according to the master computer software programming co-ordinated with the board 42 used.

In operation, the electronic data processing means 34 is first plugged into the master computer 82 to clear all previously recorded data from the processing means 34, and to give the processing means its processing instructions, including the time frame periods to be used and the correct time. Then, the next traffic count to be taken having been decided upon, a suitable display board 42 having the desired traffic pattern 44 and symbolic traffic events 46 thereon is superimposed on the mounting base 36, thereby leaving exposed the pushbuttons 48 corresponding to the symbolic traffic events 46 displayed on the particular display board 42. A suitable display board may be a four-way intersection board as shown by board 42 in FIGS. 1 and 2, a three-way intersection display board 108 as shown in FIG. 3, a straight road traffic volume display board 110 as shown in FIG. 4, a pedestrian crossing display board 112 as shown in FIG. 5, or any other different display board 42 designed to suit whatever traffic passageway and traffic events are desired to be observed and recorded.

The traffic checker then need only proceed to the particular intersection or location at which the traffic count is to be conducted and orient the display board 42 relative to the intersection according to instructions. The checker then puts the signature switch 70 in the ON position and proceeds to push the suitable pushbuttons 48 at the occurrence of each traffic event to be recorded. When the count is completed, the signature switch 70 is put in the OFF position, and the apparatus is normally returned to the master computer 82. However, a different display board 42 may be substituted on the mounting base 36 in place of the original, and the same steps as just outlined may be followed to make another count, or counts, before returning to the computer 82. When a count, or counts, has been completed, the portable recording apparatus 20 is returned and plugged-in to the host or master computer 82. The data recorded in the apparatus 20 is removed by the computer 82 for storage in its own memory, and the desired print-outs of tabulated data may be made by the computer 82 and its auxiliary equipment at any suitable time, according to its own predetermined programs. The storage batteries 78 may then be put on charge to make ready for the next plug-in to the master computer 82 for instructions and for the next cycle of counts.

Figure 3:
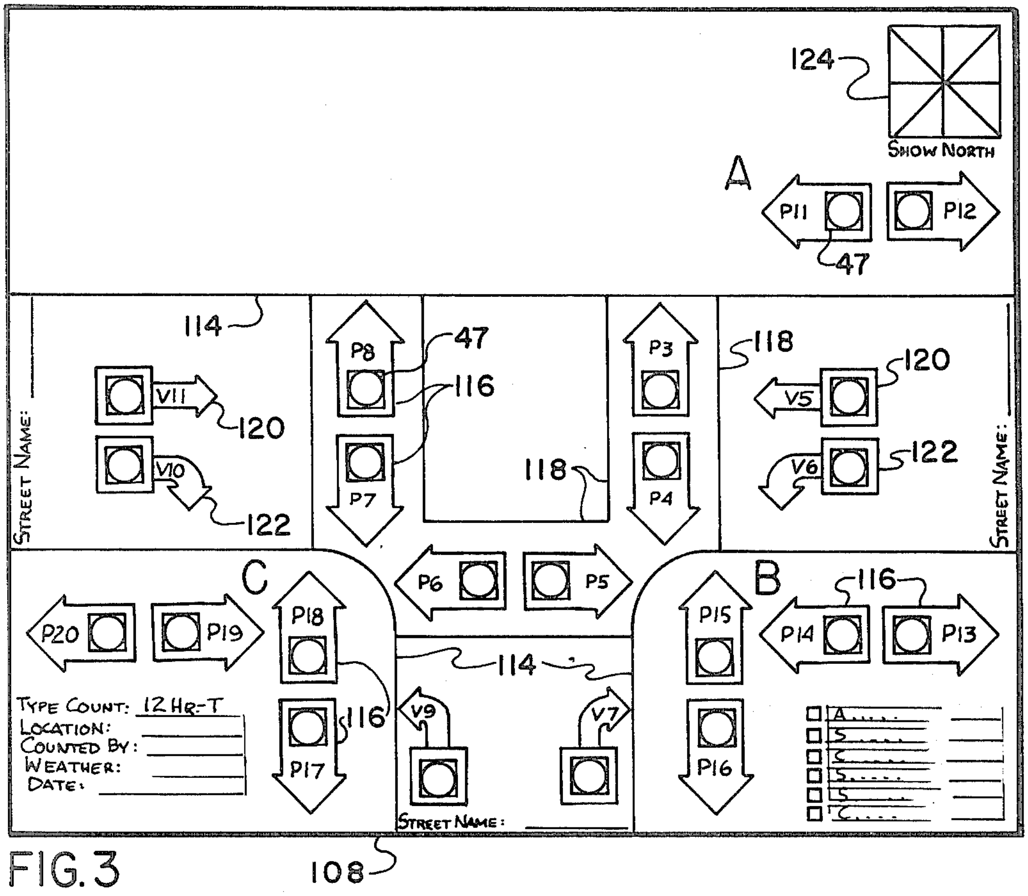
FIGS. 3, 4, and 5 are plan views of traffic pattern display boards illustrating a variety of typical traffic patterns used with the device illustrated in FIG. 1.
Figure 4:
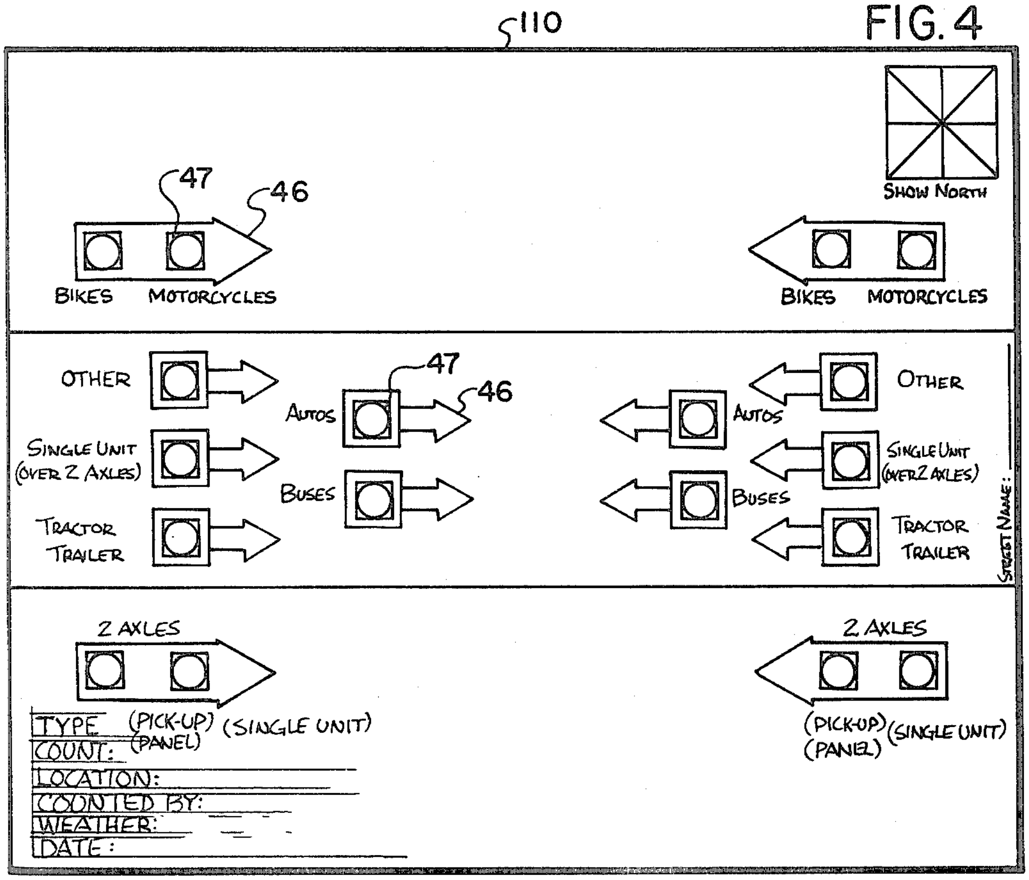
Figure 5:
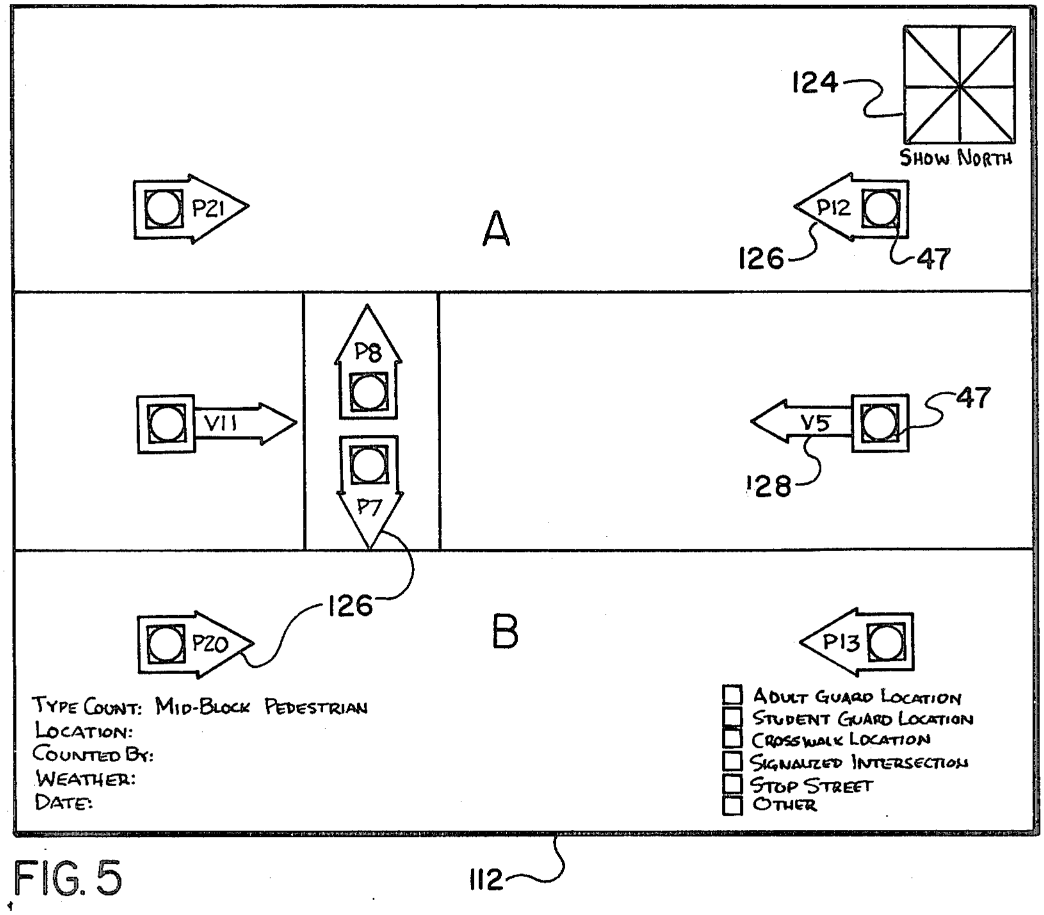

As shown on the display boards 42, 108, 110, and 112, of FIGS. 1 and 2, 3, 4, and 5 respectively, all types of intersections, passageways, and traffic events may be displayed thereon, and the meanings of the symbols are normally quite obvious. In FIG. 3, for example, the streets of an intersection are represented by the curb lines 114, pedestrian traffic by the arrow symbols 116 both outside the curbs 114 and inside the curbs 114, but inside cross-walk line symbols 118, and vehicle traffic symbols 120 and 122 represent straight ahead and turning vehicles, respectively. An orientation symbol 124 permits orientation of the apparatus in the field according to instructions. A display board 110, for example, is designed for a volume count of passing vehicles by type, and each symbol at the left of the board represents a different category of vehicles, while those at the right represent corresponding categories respectively. Display board 112 represents a pedestrian crossing over a street, and the large arrow symbols 126 represent pedestrian traffic, while the small arrow symbols 128 represent vehicular traffic of any kind, without category.

Thus, a checker with no particular skills or knowledge can be sent out to a traffic passageway with only a minimum of instruction as to orienting the traffic event recorder or apparatus 20, turning the signature switch 70 to ON, and pressing the obvious pushbuttons 48 as vehicular or pedestrian traffic passes by. The apparatus 20 of the present invention is readily converted from one type of intersection or passageway to another and from one type of counting to another by virtue of the interchangeable display boards 42. Moreover, there are no counting tally sheets to be changed, lost, or damaged; the checker need not keep track of the time except in a general way (if he has been instructed to make a four, six, or eight hour count, for example); and the apparatus inherently records whether the checker was on the job and counting during each time frame period (usually five minutes). Since the apparatus 20 is working on a real time basis as defined by the five-minute periods, it eliminates any possibility of fabricating a big count in a short period to compensate for unauthorized absence from the job. Also, the apparatus 20 puts the whole accumulation and tabulation process on an automated, almost instantaneous basis, requiring essentially none of the laborious clerical work associated with prior art counting systems.

The particular embodiments disclosed in full detail herein and illustrated in the drawings have been provided for disclosure purposes only, are subject to variations in physical form and arrangement, and are not intended to limit the scope of the present invention, which is to be determined by the scope of the appended claims.

We claim:

1. Apparatus for recording traffic events occurring at a variety of vehicular traffic passageways comprising:

(a) a portable housing unit;

(b) electronic data processing means contained in said housing unit;

(c) a plurality of display boards, each such display board displaying different vehicular traffic patterns and symbolic traffic events thereon, and each such display board being selectively and alternately mountable on said portable housing unit;

(d) a plurality of manually operated signaling means disposed at predetermined locations, said locations being selected to cause at least some of said plurality of signaling means to coincide with particular ones of said symbolic traffic events displayed on each said display board when it is mounted on said housing unit, and each said signaling means generating an electrical signal each time it is operated;

(e) electrical means interconnecting said plurality of signaling means and said electronic data processing means; and (f) said electronic data processing means including an electronic memory means for receiving and storing said electrical signals generated by said signaling means.

2. Apparatus for recording traffic events as defined in claim 1 and further characterized in that said housing unit includes electrical transfer means having an external outlet for permitting said electronic data processing means to be connected to a master computer for abstracting said stored electrical signals from said electronic memory means for processing by said master computer.

3. Apparatus for recording traffic events as defined in claim 1 and further characterized in that timing means is provided for generating a timing signal at predetermined time intervals, said timing means being connected to said electronic data processing means for transmitting said timing signals thereto to provide a time frame for said electrical signals generated by said signaling means.

4. Apparatus for recording traffic events as defined in claim 1 and further characterized in that said housing unit includes mounting means to which all of said signaling means are mounted at fixed locations thereon, and in that each said display board is suitably shaped to be selectively superimposed on said mounting means in fixed relation thereto, each said display board having a plurality of openings formed therein at locations associated with said symbolic traffic events displayed thereon to correspond with and thereby expose one of said signaling means at each said symbolic traffic event display.

5. Apparatus for recording traffic events as defined in claim 4 and further characterized in that said signaling means comprise pushbutton switches.

* * * * *